US007605970B2

(12) United States Patent
Huang et al.

(10) Patent No.: US 7,605,970 B2
(45) Date of Patent: Oct. 20, 2009

(54) EXTERNAL CAVITY TUNABLE LASER SYSTEM FORMED FROM MEMS CORNER MIRROR

(75) Inventors: Long-Sun Huang, Taipei (TW); Chao-Sen Chang, Tainan (TW); Ta-Shun Chu, Taipei (TW); Son-Nan Chen, Taoyuan (TW)

(73) Assignee: Walsin Lihwa Corp., Taipei (TW)

( * ) Notice: Subject to any disclaimer, the term of this patent is extended or adjusted under 35 U.S.C. 154(b) by 325 days.

(21) Appl. No.: 10/977,044

(22) Filed: Oct. 29, 2004

(65) Prior Publication Data
US 2005/0123017 A1    Jun. 9, 2005

(30) Foreign Application Priority Data
Nov. 28, 2003   (TW)   ............................... 92133593 A

(51) Int. Cl.
*G02B 26/00*   (2006.01)
(52) U.S. Cl. ........................................ 359/291; 359/292
(58) Field of Classification Search ................ 359/290, 359/291, 292, 293, 295, 298, 220, 223, 224, 359/320, 323, 324, 847, 850, 855, 856, 857, 359/861, 872, 873, 874
See application file for complete search history.

(56) References Cited
U.S. PATENT DOCUMENTS

| | | | | |
|---|---|---|---|---|
| 2,437,807 A * | 3/1948 | Dowell et. al. | ................. | 353/41 |
| 4,293,209 A * | 10/1981 | Kurei | .......................... | 396/272 |
| 6,654,155 B2 * | 11/2003 | Rosa et al. | ................... | 359/290 |
| 7,042,609 B2 * | 5/2006 | Buzzetta | ..................... | 359/225 |
| 7,057,796 B1 * | 6/2006 | Wilde | .......................... | 359/291 |
| 7,064,878 B2 * | 6/2006 | Nanjyo et al. | ............... | 359/212 |
| 7,171,068 B2 * | 1/2007 | Bartlett et al. | ................. | 385/17 |
| 2002/0171901 A1 * | 11/2002 | Bernstein | .................... | 359/199 |

* cited by examiner

*Primary Examiner*—Ricky L Mack
*Assistant Examiner*—Tuyen Q Tra
(74) *Attorney, Agent, or Firm*—Volpe and Koenig, P.C.

(57) ABSTRACT

A tunable laser system is provided. The tunable laser system includes a light source, a grating, a corner mirror array, and a receiver. In which, the light source emits a beam, and the grating is located in front of the light source for reflecting the beam to form a first reflective beam. Also, the corner mirror array is located in front of the grating for receiving the first reflective beam and forms a second reflective beam accordingly. In addition, the receiver is used to receive a third reflective beam formed from reflecting the second reflective beam through the grating.

20 Claims, 5 Drawing Sheets

EXTERNAL CAVITY TUNABLE LASER SYSTEM FORMED FROM MEMS CORNER MIRROR

FIELD OF THE INVENTION

The present invention relates to a laser system, and more particular to a tunable laser system arranged with a corner mirror array.

BACKGROUND OF THE INVENTION

Since the late 1980s, the micro-electromechanical system (MEMS) has gotten a lot of attention. MEMS is the general name for the integrated micro-elements and systems. Furthermore, MEMS includes the electrical and mechanical components manufactured by the batch processing technology applying the integrated circuit (IC) compatibility. In addition, the sizes of the manufactured components are ranged from micrometers to millimeters.

Since MEMS has the properties, such as compact volumes, powerful functions and low costs, etc., various industries including semiconductor industry, electronics industry, engineering industry, communication industry, bioindustry, and chemical industry have invested huge capitals in relevant researches. Accordingly, the relevant products, such as accelerators, optical communication switches and biosensors are presented to the public one by one.

Since the first ruby laser was presented in 1960s, other lasers, such as the gas laser and the semiconductor laser, are presented successively and rapidly developed. In which, the tunable lasers are widely applied in the science fields, such as the optical fiber communications, the optical data processing and the multi-wavelength interferences. The grating-feedback external cavity tunable laser is especially conspicuous because of its manifold advantages, such as the wide ranges of the tunable wavelengths, the narrow bandwidths of signals, low costs, simple operations and being driven easily.

Due to the keen competitions in the communication technologies, the optical fiber communications must be gradually changed from the recent long-distance telecommunication networks and cable television arterial networks to the short-distance local information networks and subscriber loops. Since the optical communication active elements and the simulation technologies are the determinants of the optical communication industries, various factories are devoted to improve the efficacies of the optical communication active elements. Further, due to the tunable laser is an essential component to the optical communication active elements, to find out the way of how to improve the tunable laser has become the topical subject.

The conventional grating-feedback external cavity tunable laser systems can be simply divided into three types, the Littrow type, the Grazing incident type, and the Fabry-Perot type. In which, the laser of the Littrow type has high diffraction efficiency but low resolution. The laser system of the Grazing incident type has higher resolution than that of the Littrow type because its incident beam is oblique to the grating. Further, the laser system of the Grazing incident type usually includes a reflector, a lens and an I-type plate or a V-type plate, so that it is possible to control the wavelength of the output light by fine adjusting the relevant angles between the components. Nevertheless, the structure of the laser system of the Grazing incident type is more complex than that of the Littrow type because it has the additional components of I-type plate or the V-type plate. In addition, the laser system of the Fabry-Perto type does not use the above design of gratings, it disperses the light by the resonance cavity composed of one side of a laser diode, which is the light source of the laser system and has the other side coated with a resist layer, and one side of a reflector located within the laser system. The wavelengths of the output light are controlled by changing the length of the resonance cavity. Although the laser system of the Fabry-Perto type can output the lights with multi-wavelengths, its cost and structure complexity is higher than those of the Littrow type and the Grazing incident type.

As above-mentioned description, since the laser system of the Grazing incident type has better resolution than that of the Littrow type and has simpler operating process than that of the Fabry-Perot type, the grating-feedback external cavity tunable laser, one kind of the laser systems of the grating tunable incident type, has become the main subjects of the relevant researches. However, in the conventional grating-feedback external cavity tunable laser, in order to control the wavelengths of the output lights, the components with the anti-dazzling efficiency, such as the foregoing I-type plate and the V-type plate, are necessary. But, the structure complexity of the grating-feedback external cavity tunable laser is increased due to the foregoing components. Therefore, the research subject of the grating-feedback external cavity tunable laser is to simplify the structure without affecting the function of controlling the wavelengths of the output lights.

However, as to the micro optical elements within the free space, the elements which are often used to make the reflective light reflect along the direction reverse to that of the incident light are micro mirrors, micro corner mirrors, and micro corner cube, or the combination thereofwhich are shown in FIGS. 1(A)-1(C) respectively.

Please refer to FIG. 1(A). As shown in FIG. 1(A), if the incident light is parallel to the normal of the micro mirror, the reflective light would feed back along the direction reverse to that of the incident light. However, in the actual applications, in order to make the reflective lights transmitted along the direction reverse to that of the incident light, some actuators are essential for adjusting the micro mirror.

Please refer to the FIG. 1(C), which is a schematic diagram of the micro corner cube according to the prior art. Based on the micro corner cube shown in FIG. 1(C), in theory, when a incident light incidences any mirror of the corner cube, its reflective light would be transmitted along the direction reverse to that of the incident light. Accordingly, when the light spot of laser has size similar to the opening size of the corner cube, the reflective light would be considered as a reverse light of the incident light, and that is to say the optical feedback is achieved. The three mirrors of the corner cube are separately manufactured by the buck micromachining technology of MEMS. However, since the three mirrors are combined with one another via fasteners, the perpendicularities between any two mirrors are not easily controlled.

Please refer to the FIG. 1(B), which is a schematic diagram of the micro corner mirror according to the prior art. As to the micro corner mirror shown in FIG. 1(B), in theory, when an incident light incidences one mirror of the corner mirror, its reflective light would be transmitted along the direction reverse to that of the incident light. Accordingly, when the light spot has the size similar to the opening size of the corner mirror, the reflective light would be considered as a reverse light of the incident light, and that is to say the optical feedback is achieved. Therefore, when one of the mirrors is rotated and the perpendicularity between the two mirrors is destroyed accordingly, the optical feedback would not be achieved. That is to say the optical feedback is selective. Further, with regard to a laser system having plural corner mirrors arranged therein, since the perpendicularities of the plural corner mirrors are able to be selectively destroyed, the wavelengths of the irradiative lights of the laser system are controllable.

Therefore, in order to reduce the complexity of the structures and increase the conveniences of selecting the wavelengths of the output lights, a new tunable laser system having the micro corner mirror array manufactured by MEMS technology is ably needed in the industry.

In addition, the general allowable error range of the perpendicularity standard for the present merchant corner mirror is ±0.08°, which is caused by the mechanical errors or artificial errors. However, the error range of ±0.08° is negligible for general optical elements, but it is enormous for MEMS elements. In other words, a new corner mirror type having more accurate perpendicularity is desirous. Thus, to improve the perpendicularity accuracy of the corner mirror is also a research subject for semiconductor laser system.

In the view of aforesaid discussion, how to built a laser system having better resolution, compacter structure, easier operating processes, tunable wavelengths of the output lights, and lower cost is an industrial subject at present.

SUMMARY OF THE INVENTION

It is an object of the present invention to provide a corner mirror. The corner mirror includes a first mirror having a revolving spindle, a spacer connected to the first mirror and being apart from the revolving spindle, and a second mirror connected to the spacer so as to be arranged perpendicular to the first mirror.

Preferably, a thickness of the spacer is determined by an included angle between the first mirror and the second mirror.

Preferably, the revolving spindle and the spacer are respectively located at two opposite sides of the first mirror.

Preferably, the first mirror and the second mirror are respectively connected to two opposite surfaces of the spacer.

Preferably, the first mirror is a first lattice surface.

Preferably, the second mirror is a second lattice surface.

Preferably, the corner mirror further includes an upper electrode contacting with the revolving spindle and being combined with the first mirror.

Preferably, the corner mirror further includes a lower electrode cooperated with the upper electrode for controlling a position of the first mirror.

In accordance with another aspect of the present invention, a corner mirror array is provided. The corner mirror array includes a first mirror array, a first electrode array connected to the first mirror array, a set of spacers, and a second mirror array. In which, each of the spacers includes a first connecting surface and a second connecting surface, and each the first connecting surface is connected to the first mirror array. In addition, the second mirror array is connected to the second connecting surfaces so as to be arranged perpendicular to the first mirror array.

Preferably, the first mirror array further includes a second electrode array.

Preferably, the first mirror array further includes plural first mirrors.

Preferably, each of the plural first mirrors further includes a revolving spindle respectively.

Preferably, when a force exists between the first electrode array and the second electrode array, each of the plural first mirrors rotates around the revolving spindle respectively.

Preferably, the second mirror array includes plural second mirrors.

Preferably, the plural first mirrors and the plural second mirrors are lattice surfaces.

Preferably, the plural first mirrors and the plural second mirrors are silicon lattice surfaces.

Preferably, the spacer set includes plural spacers for respectively connecting each of the plural first mirrors to each of the second mirrors.

In accordance with another aspect of the present invention, a tunable laser system is provided. The tunable laser system includes a light source emitting a beam, a grating located in front of the light source for reflecting the beam to form a first reflective beam, a corner mirror array located in front of the grating for receiving the first reflective beam and forming a second reflective beam accordingly, and a receiver for receiving a third reflective beam. In which, the third reflective beam is formed from reflecting the second reflective beam through the grating.

Preferably, the corner mirror array includes plural corner mirrors.

Preferably, each of the plural corner mirrors further includes a first mirror, a second mirror, a spacer, and a revolving spindle.

Preferably, the first mirror is substantially perpendicularly connected to the second mirror via the spacer.

Preferably, the first mirror is revolved around the revolving spindle due to an external force so that a direction and a wavelength of the second reflective beam are changed accordingly.

Preferably, the tunable laser system further includes a dispersing device located between the grating and the corner mirror array.

Preferably, the dispersing device is a first lens.

Preferably, the first reflective beam is dispersed into plural dispersed beams by the dispersing device.

Preferably, the light source is a laser.

Preferably, the receiver is a second lens with a gradually varying refractivity.

Preferably, the third reflective beam is refracted into a refractive beam by the second lens.

Preferably, the tunable laser system further includes an optical fiber for transmitting the refractive beam.

The above contents and the advantages of the present invention will become more readily apparent to those ordinarily skilled in the art after reviewing the following detailed descriptions and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1C:
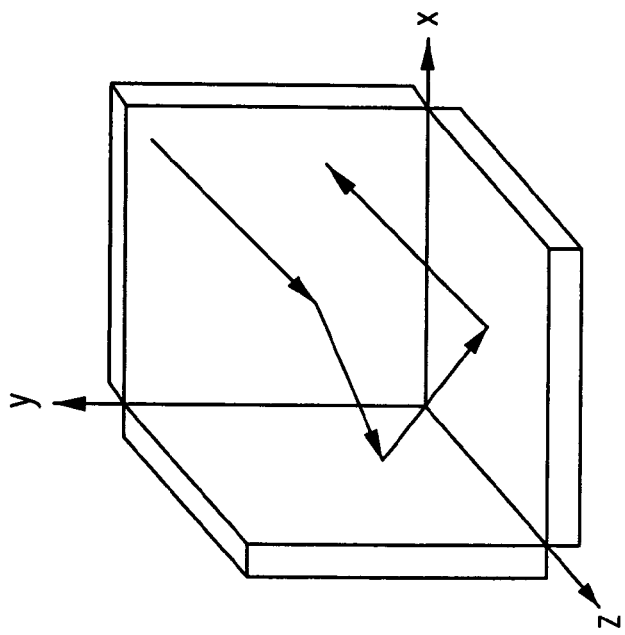
FIGS. 1(A)-(C) are the schematic diagrams of the optical elements used to achieve the optical feedback according to the prior arts.
Figure 1B:
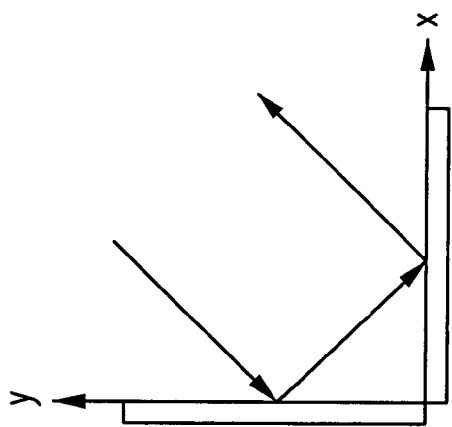
Figure 1A:
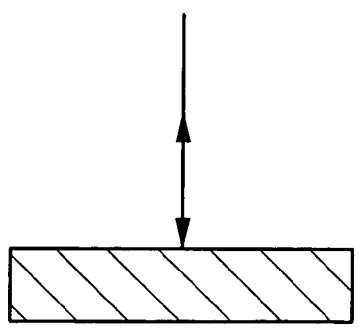
Figure 2A:
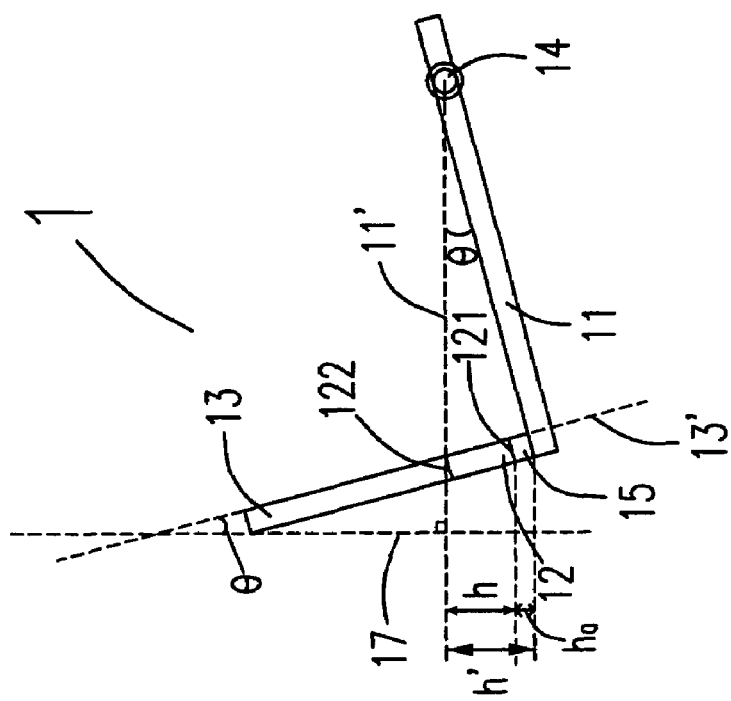
FIGS. 2(A)-(B) are the schematic diagrams of the corner mirror according to a preferred embodiment of the present invention.
Figure 2B:
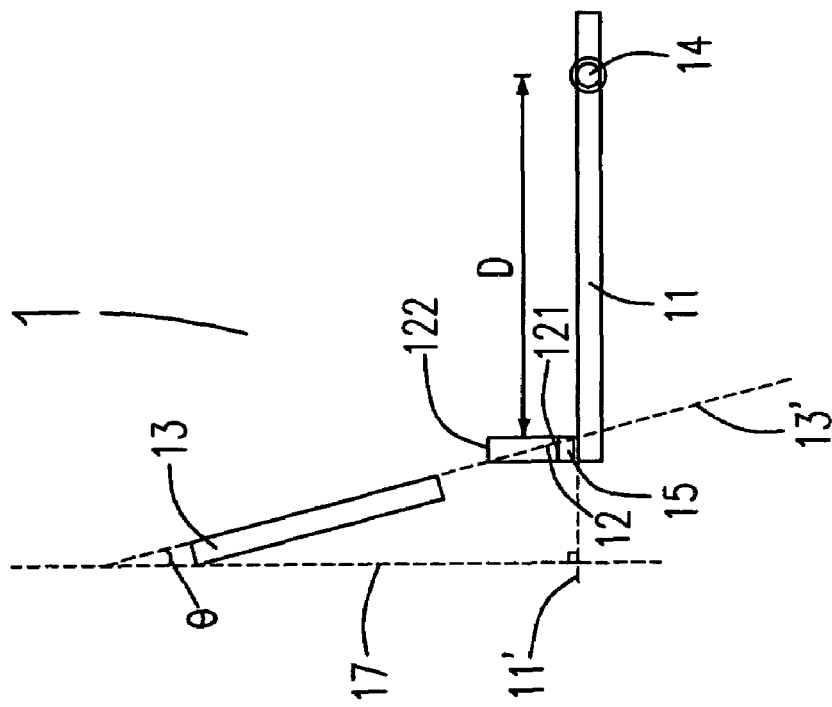

Please refer to FIGS. 2(A)-(B), which are the schematic diagrams of the corner mirror according to a preferred embodiment of the present invention. In which, a spacer is used to improve the perpendicularity accuracy of the corner mirror. As shown in FIGS. 2(A)-(B), the corner mirror 1 includes the horizontal mirror 11, the spacer 12, the vertical mirror 13, the revolving spindle 14, and the glue 15. In which, the horizontal mirror 11 and the vertical mirror 13 are silicon lattice surfaces, the glue 15 is benzocyclobutene (BCB), such as BCB_4022 and BCB_4026, and the spacer 12 includes a first bonding surface 121 and a second bonding surface 122.

Since the alignments of the assembling equipments of the corner mirror would be decreased day by day for the reason that the abrasion and deviations may exist on the mirror surfaces, which are the surfaces of the horizontal mirror 11 and vertical mirror 13, the perpendicularity of the assembled corner mirror 1 would be various. In order to improve the perpendicularity of the corner mirror 1, the spacer 12 and the revolving spindle 14 are used in this preferred embodiment. When the vertical mirror 13 is pushed down for bonding with the horizontal mirror 11, the vertical mirror 13 would press the spacer 12 and the horizontal mirror 11 would revolve around the revolving spindle 14 accordingly. Therefore, the perpendicularity between the vertical mirror 13 and the horizontal mirror 11 is adjusted by serving the spacer 12. The specific principles are described as follows.

Step 1, when the included angle between the extending line 11' of the mirror 11 and the extending line 13' of the vertical mirror 13 is larger than 90°, the error angle θ between the extending line 13' of the vertical mirror 13 and the vertical line 17 is measured. Contrarily, if the included angle between the extending line 11' of the mirror 11 and the extending line 13' of the vertical mirror 13 is smaller than 90°, one of the vertical mirror 13 and the horizontal mirror 11 is reversed first for making the included angle between the extending line 11' of the mirror 11 and the extending line 13' of the vertical mirror 13 larger than 90°. Then, similarly, the new error angle θ between the extending line 13' of the vertical mirror 13 and the vertical line 17 is measured. Step 2, the distance D between the spacer 12 and the revolving spindle 14, and the thickness ha of the glue 15 are measured. Step 3, the thickness h of the spacer 12 is determined. The relevant equations are shown as follows.

$$h+ha=D\times\theta$$

$$h=h'-ha \text{ (when } \theta \text{ is close to 0)}$$

The reference symbol h' denotes the ideal displacement of the horizontal mirror 11. In addition, it's well-known that cosine θ could be considered as 1, when θ is close to 0°. When the included angle between the extending line 13' of the vertical mirror 13 and the extending line 11' of the horizontal mirror 11 is adjusted to be 90°, the error angle θ is close to 0° and the ideal displacement h' substantially equals to the sum of the thickness h of the spacer 12 and the thickness ha of the glue 15. In other words, the sum of the thickness h of the spacer 12 and the thickness ha of the glue 15 could be considered as the ideal displacement h', since the error angle θ is very small and the theoretical displacement h' should theoretically be (ha+h)×cosine θ. Further, since the distance D and the thickness ha of the glue 15 are known, and the error angle θ is small, the thickness h of the spacer 12 is determined.

As the above, changing the sum of the thickness h of the spacer 12 and the thickness ha of the glue 15 may determine whether the practical displacement meets the ideal displacement h'. In other words, the thickness h or the thickness ha could be the determinant for the perpendicularity of the corner mirror 1. However, for a convenience, in this preferred embodiment, the thickness ha of glue 15 is measured. Therefore, in order to improve the perpendicularity of the corner mirror 1, the thickness h of the spacer 12 is the determinant in this preferred embodiment. Incidentally, the perpendicularity of the corner mirror 1 generated in this preferred embodiment is 90±0.015°, in which the error range of ±0.015° is much more precise than the allowable error range of 0.08°.

Figure 3A:
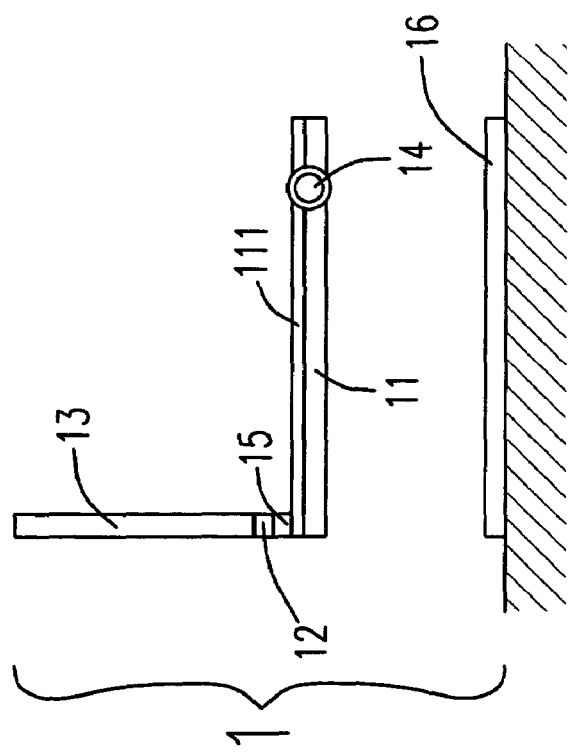
FIGS. 3(A)-(B) are the schematic diagrams of the actuations of the corner mirrors according to a preferred embodiment of the present invention.
Figure 3B:
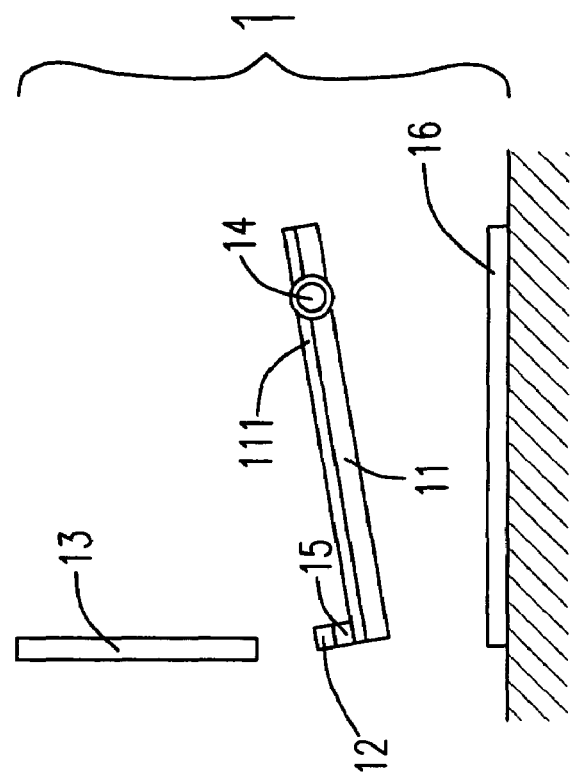

Please refer to FIGS. 3(A)-(B), which are the schematic diagrams of the actuations of the corner mirrors according to a preferred embodiment of the present invention. As shown in FIGS. 3(A)-3(B), the corner mirror 1 includes the horizontal mirror 11, the spacer 12, the vertical mirror 13, the upper electrode 111, the lower electrode 16, the revolving spindle 14 and the glue 15. In which, FIG. 3(A) shows the schematic diagram of the mirror corner 1 applied with no voltage, and FIG. 3(B) shows the schematic diagram of the mirror corner 1 applied with voltage. The static force between the lower electrode 16 and the upper electrode 111 is determined by the voltage amount supplied to the lower electrode 16. In other words, controlling the voltage amount supplied to the lower electrode 16 determines whether the horizontal mirror 11 revolves around the revolving spindle 14 or not. Furthermore, the function of an optical selective switch is achieved by properly controlling the voltage supplied to the lower electrode 16. In the view of aforesaid description, the present invention provides a design applying the static to achieve an optical selective switch, so no specific devices are needed for controlling the optical feedback. In other words, the present invention meets the trend of compactness and simplification.

Figure 4:
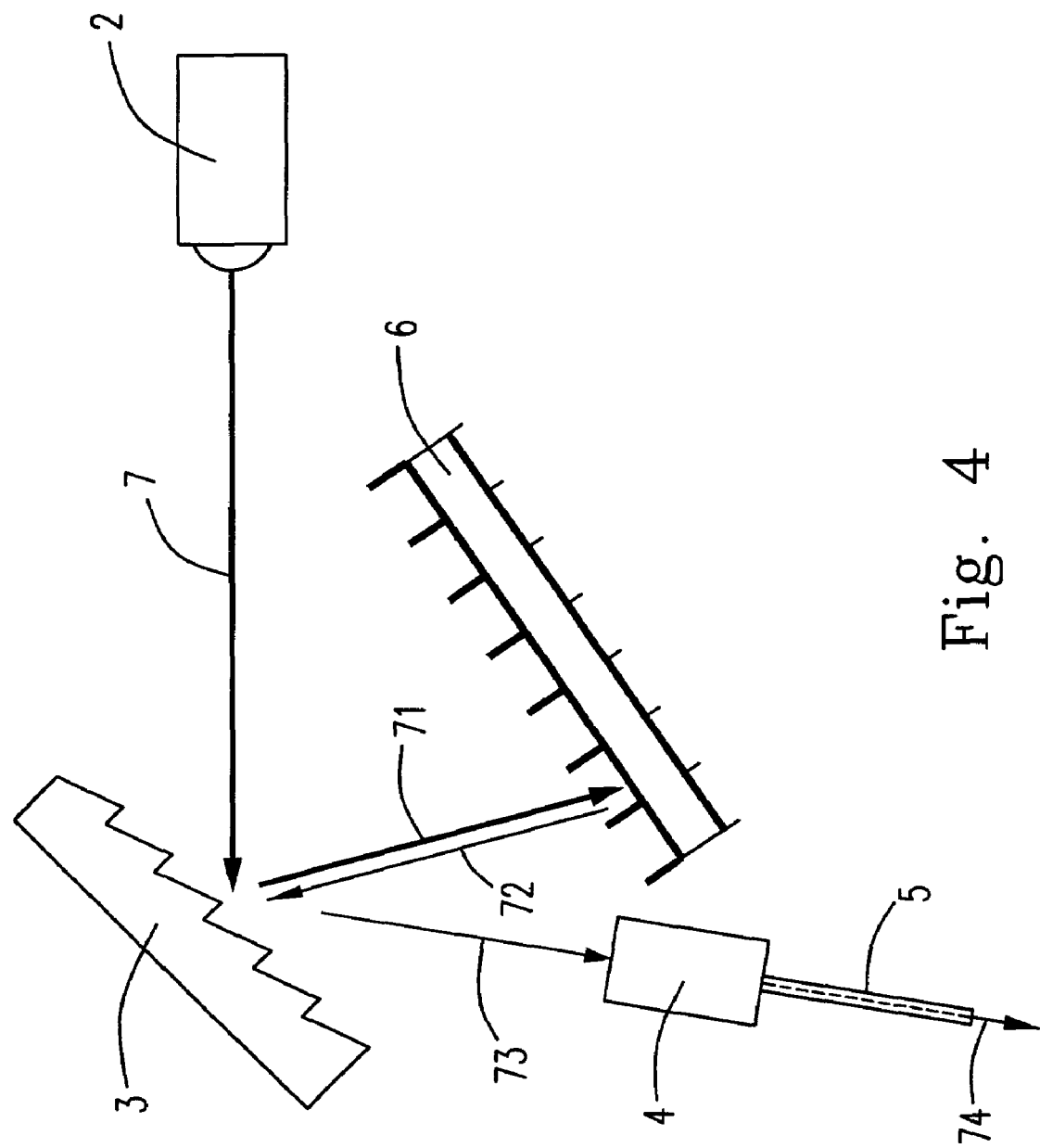
FIG. 4 is a schematic diagram of a tunable laser system with a corner mirror array according to a preferred embodiment of the present invention.

Please refer to FIG. 4, which is the schematic diagram of the corner mirror array laser system in a preferred embodiment according to the present invention. As shown in FIG. 4, the corner mirror array laser system includes the laser diode 2, the grating 3, the receiver 4, the optical fiber 5, and the corner mirror array 6. In which, the beam 7 emitted from the laser diode 2 is reflected and becomes the first reflective beam 71 by the grating 3. Then, the second reflective beam 72 having the selective wavelengths is formed by modulating and reflecting the first reflective beam 71 with the corner mirror array 6. After that, the second reflective beam 72 is reflected and becomes the third reflective beam 73 by the grating 3. The receiver 4 receives the third reflective beam 73 and the output beam 74 is transmitted via the optical fiber 5. In general, the first reflective beam 71 is the reflective beam in the $-1^{st}$ reflective direction of the beam 7 after the beam 7 is spread out by the grating 3.

The corner mirror array 6 is composed of plural corner mirrors 1 shown in FIGS. 2(A)-(B). Since the actuation state of the corner mirrors 1 is determined by the supplied voltages, the optical feedback functions of the corner mirror array including the plural corner mirrors are alternative. In other words, each corner mirror works as an optical switch since it determines a specific wavelength and a channel of the second reflective beam 72. Furthermore, the wavelengths and channels of the second reflective beam 72 are determined by selectively controlling the actuation states of the corner mirrors. Accordingly, a user can determine the optical feedback having desirous wavelengths and channels by selectively controlling the optical switches (the plural corner mirrors). That is to say the second reflective beam 72, the third reflective beam 73, and the output beam 74 (transmitted via the optical fiber 5) might be in a single mode (with a single wavelength and a single channel) or in a multiple mode (with multiple wavelengths and multiple channels). For example, when it is needed that the output beam 74 has to be a light with a wavelength of 1550.8 nm, or of 1551.6 nm, or of 1550 nm, the embodiment can function as a single mode. Contrarily, when it is needed that the output beam 74 has to simultaneously include the wavelengths of 1550 nm, 1550.8 nm and 1551.6 nm, the embodiment can function as a multiple mode.

Figure 5:
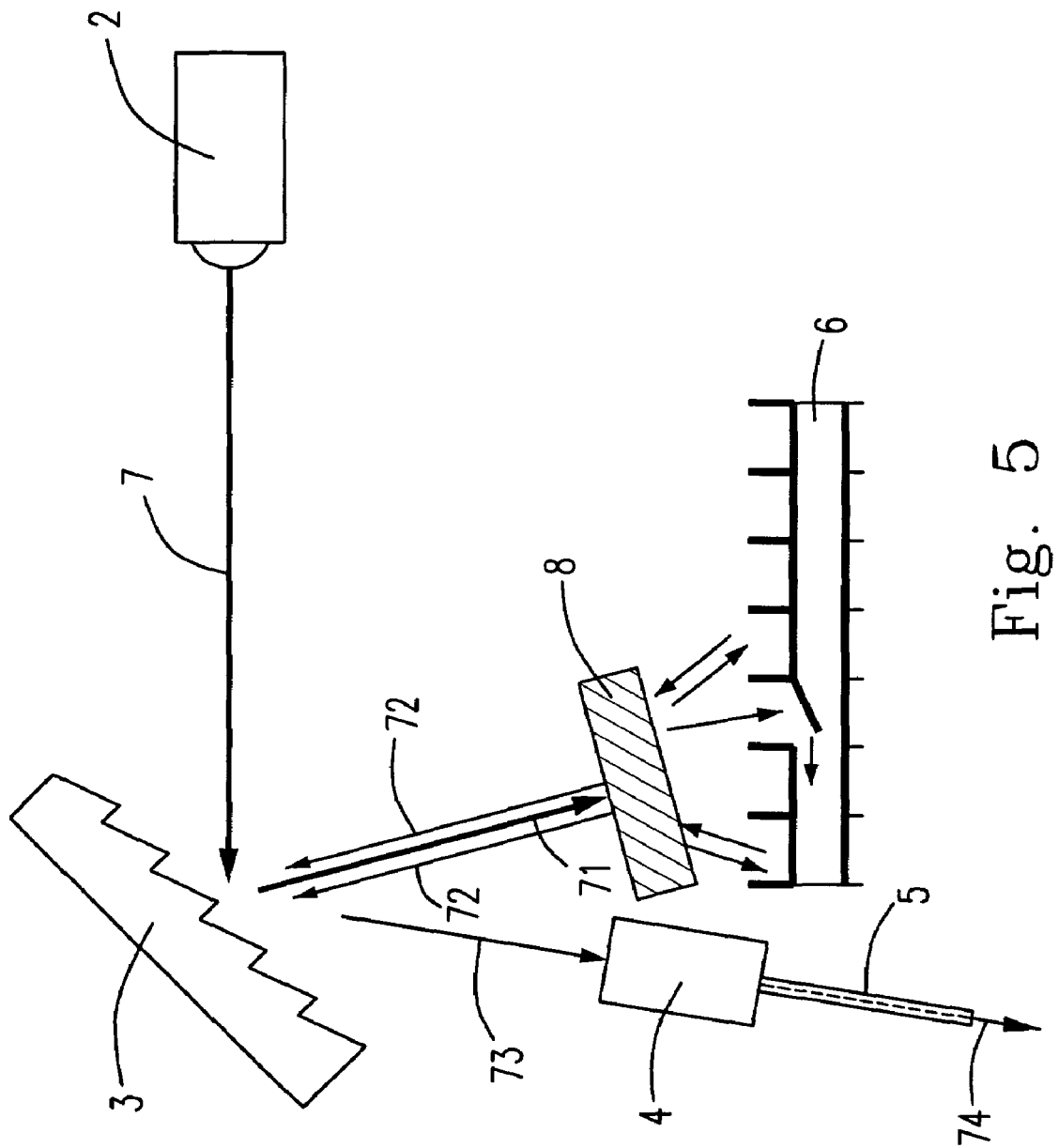
FIG. 5 is a schematic diagram of a tunable laser system with a corner mirror array according to another preferred embodiment of the present invention.

Please refer to FIG. 5, which is the schematic diagram of the corner mirror array laser system according to another preferred embodiment of the present invention. As shown in FIG. 5, the corner mirror array laser system includes the laser diode 2, the grating 3, the receiver 4, the optical fiber 5, the corner mirror array 6 and the concave lens 8. In which, the first reflective beam 71 is divided into many parts by being dispersed by the concave lens 8 according to the wavelengths thereof. Further, the particle reflective beam 71 hitting the closed corner mirrors of the corner mirror array 6 would be reflected and construct the second reflective beam 72, and the parts of the reflective beam 71 hitting the open corner mirrors of the corner mirror array 6 would be reflected into other directions and would not construct the second reflective beam 72. Therefore, the wavelengths of the second reflective beam 72, the corresponding third reflective beam 73, and the corresponding output beam 74 could be more precisely selected by the concave lens 8. As the above, a more precise optical feedback is achieved in this embodiment.

In the view of the foresaid discussion, the present invention provides a new design with a spacer to improve the perpendicularity accuracy of the corner mirror, and a new laser system with a controllable corner mirror array to easily select the wavelengths of the output beam. Further, since the used corner mirrors have better perpendicularities than those of the prior art, the tunable laser according to the present invention has better resolutions and optical feedback efficiency. In addition, since it is possible to use the tunable laser system according to the present invention in a single mode or in a multiple mode, the applied fields of the relevant instruments arranged with the tunable laser system according to the present invention is enormously widened.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A corner mirror, comprising:
a first mirror having a revolving spindle connected thereto;
a spacer connected to said first mirror and being apart from said revolving spindle; and
a second mirror being apart from said revolving spindle and connected to said spacer so as to be arranged perpendicular to said first mirror.

2. The corner mirror according to claim 1, wherein a thickness of said spacer is determined by an included angle between said first mirror and said second mirror.

3. The corner mirror according to claim 1, wherein said revolving spindle and said spacer are respectively located at two opposite sides of said first mirror.

4. The corner mirror according to claim 1, wherein said first mirror and said second mirror are respectively connected to two opposite surfaces of said spacer.

5. The corner mirror according to claim 1, wherein said first mirror is a first lattice surface.

6. The corner mirror according to claim 1, wherein said second mirror is a second lattice surface.

7. The corner mirror according to claim 1 further comprising an upper electrode contacting with said revolving spindle and being combined with said first mirror.

8. The corner mirror according to claim 7 further comprising a lower electrode cooperated with said upper electrode for controlling a position of said first mirror.

9. A corner mirror according to claim 1, wherein said first and said second mirrors cause a light emitting to said first mirror along a first direction to be reflected by said second mirror along a second direction opposite to said first direction.

10. A corner mirror according to claim 1, wherein said first and said second mirrors cause a light emitting to said second mirror with an incident direction to be reflected with a reflective direction opposite to said incident direction.

11. A corner mirror according to claim 1, wherein said revolving spindle is configured within said first mirror.

12. A corner mirror array, comprising:
a first mirror array;
a first electrode array connected to said first mirror array;
a set of spacers, each of which comprises a first connecting surface and a second connecting surface, wherein each said first connecting surface is connected to said first mirror array; and
a second mirror array connected to each said second connecting surface so as to be arranged perpendicular to said first mirror array and to fix the set of spacers between said first and said second mirror arrays.

13. The corner mirror array according to claim 12, wherein said first mirror array further comprises a second electrode array.

14. The corner mirror array according to claim 13, wherein said first mirror array further comprises plural first mirrors.

15. The corner mirror array according to claim 14, wherein each of said plural first mirrors further comprises a revolving spindle.

16. The corner mirror array according to claim 15, wherein when a force exists between said first electrode array and said second electrode array, each of said plural first mirrors rotates around said revolving spindle respectively.

17. The corner mirror array according to claim 14, wherein said second mirror array further comprises plural second mirrors.

18. The corner mirror array according to claim 17, wherein said plural first mirrors and said plural second mirrors are lattice surfaces.

19. The corner mirror array according to claim 17, wherein said plural first mirrors and said plural second mirrors are silicon lattice surfaces.

20. The corner mirror array according to claim 17, wherein said spacer set comprises plural spacers for respectively connecting each of said plural first mirrors to each of said second mirrors.

* * * * *